(12) United States Patent
Kishimura et al.

(10) Patent No.: US 7,041,428 B2
(45) Date of Patent: May 9, 2006

(54) PATTERN-FORMING MATERIAL AND METHOD OF FORMING PATTERN

(75) Inventors: Shinji Kishimura, Itami (JP); Masayuki Endo, Izumi (JP); Masaru Sasago, Hirakata (JP); Mitsuru Ueda, Tokyo (JP); Tsuyohiko Fujigaya, Koshigaya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 10/415,272

(22) PCT Filed: Sep. 12, 2002

(86) PCT No.: PCT/JP02/09381

§ 371 (c)(1),
(2), (4) Date: Apr. 28, 2003

(87) PCT Pub. No.: WO03/025676

PCT Pub. Date: Mar. 27, 2003

(65) Prior Publication Data

US 2004/0029035 A1    Feb. 12, 2004

(30) Foreign Application Priority Data

Sep. 13, 2001   (JP) .............................. 2001-277589

(51) Int. Cl.
*G03C 1/73*   (2006.01)
*G03F 7/39*   (2006.01)
*G03F 7/20*   (2006.01)
*G03F 7/30*   (2006.01)

(52) U.S. Cl. ............... 430/270.1; 430/325; 430/326; 430/905; 430/907; 430/910; 430/914; 430/945; 430/966; 430/967

(58) Field of Classification Search ............. 430/270.1, 430/914, 905, 907, 910, 325, 326, 945, 966, 430/967
See application file for complete search history.

(56) References Cited

U.S. PATENT DOCUMENTS

| | | | | |
|---|---|---|---|---|
| 4,689,289 A | * | 8/1987 | Crivello | 430/270.1 |
| 5,876,900 A | * | 3/1999 | Watanabe et al. | 430/288.1 |
| 6,576,392 B1 | * | 6/2003 | Sato et al. | 430/270.1 |
| 6,916,592 B1 | * | 7/2005 | Harada et al. | 430/270.1 |
| 2002/0081524 A1 | | 6/2002 | Uetani et al. | 430/270.1 |

FOREIGN PATENT DOCUMENTS

| | | |
|---|---|---|
| EP | 773478 A1 | 5/1997 |
| EP | 791856 A2 | 8/1997 |
| JP | 11-218926 A | 8/1999 |
| JP | 2000-330289 | 11/2000 |
| JP | 2000-330289 A | 11/2000 |
| JP | 2002-322217 A | 11/2002 |
| JP | 2002-333715 A | 11/2002 |

OTHER PUBLICATIONS

Fujigaya et al, "A New Photoresist Material for 157 nm Lithography-2", Journal of Photopolymer Science and Technology, vol. 15, No. 4 (2002) p. 643-654.*

* cited by examiner

*Primary Examiner*—Sin Lee
(74) *Attorney, Agent, or Firm*—McDermott Will & Emery LLP

(57) ABSTRACT

A pattern formation material of this invention contains a base polymer including a unit represented by Chemical Formula 1 and, and an acid generator:

Chemical Formula 1:

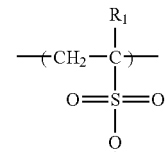

wherein $R_1$ is a hydrogen atom, a chlorine atom, a fluorine atom, an alkyl group or an alkyl group including a fluorine atom; and $R_2$ is a protecting group released by an acid.

27 Claims, 2 Drawing Sheets

(a)

(b)

(c)

(d)

(a)

(b)

(c)

(d)

PATTERN-FORMING MATERIAL AND METHOD OF FORMING PATTERN

TECHNICAL FIELD

The present invention relates to a pattern formation method and a pattern formation material, and more particularly, it relates to a pattern formation method for forming a resist pattern, for use in forming a semiconductor device or a semiconductor integrated circuit on a semiconductor substrate, by using exposing light of a wavelength not longer than a 180 nm band and a pattern formation material used in the pattern formation method.

BACKGROUND ART

Currently, in fabrication of a mass storage semiconductor integrated circuit, such as a 64 Mbit dynamic random access memory (DRAM) and a logic device or a system LSI with a 0.25 μm through 0.15 μm rule, a resist pattern is formed by using a chemically amplified resist material including a polyhydroxystyrene derivative and an acid generator as principal constituents with KrF excimer laser (wavelength: a 248 nm band) used as exposing light.

Moreover, for fabrication of a 256 Mbit DRAM, a 1 Gbit DRAM or a system LSI with a 0.15 μm through 0.13 μm rule, a pattern formation method using, as exposing light, ArF excimer laser (wavelength: a 193 nm band) lasing at a shorter wavelength than the KrF excimer laser is now under development.

The resist material including a polyhydroxystyrene derivative as a principal constituent has high absorbance against light of a wavelength of a 193 nm band because of an aromatic ring included therein. Therefore, exposing light of a wavelength of a 193 nm band cannot uniformly reach the bottom of a resist film, and hence, a pattern cannot be formed in a good shape. Accordingly, the resist material including a polyhydroxystyrene derivative as a principal constituent cannot be used when the ArF excimer laser is used.

Therefore, a chemically amplified resist material including, as a principal constituent, a polyacrylic acid derivative or a polycycloolefin derivative having no aromatic ring is used when the ArF excimer laser is used as the exposing light.

On the other hand, as exposing light for a pattern formation method capable of coping with high resolution, an electron beam (EB) and the like are being examined.

When the EB is used as the exposing light, however, the throughput is disadvantageously low, and hence, the EB is not suitable to mass production. Thus, the EB is not preferred as the exposing light.

Accordingly, in order to form a resist pattern finer than 0.10 μm, it is necessary to use exposing light of a wavelength shorter than that of the ArF excimer laser, such as $Xe_2$ laser (wavelength: a 172 nm band), $F_2$ laser (wavelength: a 157 nm band), $Kr_2$ laser (wavelength: a 146 nm band), ArKr laser (wavelength: a 134 nm band), $Ar_2$ laser (wavelength: a 126 nm band), soft X-rays (wavelength: a 13, 11 or 5 nm band) and hard X-rays (wavelength: not longer than a 1 nm band). In other words, a resist pattern is required to be formed by using exposing light of a wavelength not longer than a 180 nm band.

Therefore, the present inventors have formed resist patterns by conducting pattern exposure using a $F_2$ laser beam (wavelength: a 157 nm band) on resist films formed from conventionally known chemically amplified resist materials respectively including a polyhydroxystyrene derivative represented by Chemical Formula 31, a polyacrylic acid derivative represented by Chemical Formula 32 and a polycycloolefin derivative represented by Chemical Formula 33.

Chemical Formula 31:

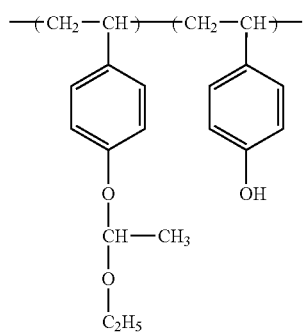

Chemical Formula 32:

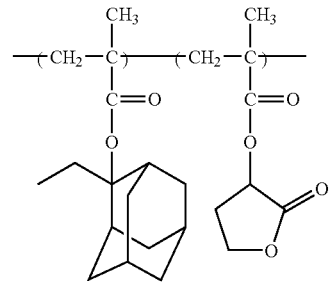

Chemical Formula 33:

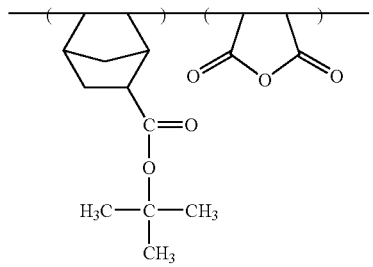

Now, a method for forming a resist pattern by using any of the aforementioned conventional chemically amplified resist materials and problems arising in the conventional method will be described with reference to FIGS. 2(a) through 2(d).

First, as shown in FIG. 2(a), the aforementioned chemically amplified resist material is applied on a semiconductor substrate 1 by spin coating and the resultant is heated, so as to form a resist film 2 with a thickness of 0.3 μm. Thereafter, as shown in FIG. 2(b), the resist film 2 is irradiated with a $F_2$ laser beam 4 through a mask 3 for pattern exposure. Thus, an acid is generated from the acid generator in an exposed portion 2a of the resist film 2 while no acid is generated in an unexposed portion 2b of the resist film 2.

Next, as shown in FIG. 2(c), the semiconductor substrate 1 is heated with a hot plate 5 at a temperature of, for example, 100° C. for 60 seconds.

Then, the resist film 2 is developed with an alkaline developer, thereby forming a resist pattern 6 as shown in FIG. 2(d).

However, as shown in FIG. 2(d), the resist pattern 6 is formed in a defective pattern shape, and there remains much scum (residues) on the semiconductor substrate 1. Such problems occur not only in using the $F_2$ laser beam as the exposing light but also in using any of the other light of a wavelength not longer than a 180 nm band.

Accordingly, a resist pattern cannot be practically formed by irradiating a resist film formed from any of the aforementioned chemically amplified resist materials with light of a wavelength not longer than a 180 nm band.

DISCLOSURE OF THE INVENTION

In consideration of the aforementioned conventional problems, an object of the invention is forming a resist pattern in a good pattern shape by using exposing light of a wavelength not longer than a 180 nm band with minimally producing scum.

The present inventors have studied the cause of the conventional problems occurring in using the conventional chemically amplified resist materials and have found the following:

First, the chemically amplified resist materials have high absorbance against light of a wavelength not longer than a 180 nm band. For example, a resist film with a thickness of 100 nm formed from the chemically amplified resist material including a polyhydroxystyrene derivative has transmittance of 20% at most against a $F_2$ laser beam (wavelength: a 157 nm band).

Therefore, various examination has been made on means for improving the transmittance of a chemically amplified resist material against light of a wavelength not longer than a 180 nm band. As a result, it has been found that a unit represented by Chemical Formula 1 below improve the transmittance against light of a wavelength not longer than a 180 nm band.

The present invention was devised on the basis of the aforementioned finding, and specifically provides pattern formation materials and methods described below.

The first pattern formation material comprises a base polymer including a unit represented by Chemical Formula 1; and an acid generator:

Chemical Formula 1:

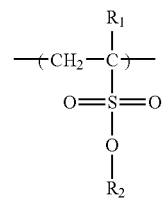

wherein $R_1$ is a hydrogen atom, a chlorine atom, a fluorine atom, an alkyl group or an alkyl group including a fluorine atom; and $R_2$ is a protecting group released by an acid.

Since the base polymer of the first pattern formation material includes the aforementioned unit, the transmittance of a resist film against light of a wavelength not longer than a 180 nm band is improved. Also, since sulfonic acid is generated when the protecting group is released from the unit, the solubility in a developer can be improved, and hence, the contrast in the solubility between an exposed portion and an unexposed portion of the resist film is improved.

In the first pattern formation material, the base polymer can be prepared through radical polymerization of the unit.

In the first pattern formation material, the base polymer can be prepared by obtaining a polymer through radical polymerization of the unit and a precursor obtained before substituting $R_2$ for the unit and by allowing $R_2$ to bond to the precursor included in the polymer.

In the first pattern formation material, the base polymer can be prepared by obtaining a polymer through radical polymerization of a precursor obtained before substituting $R_2$ for the unit and by allowing $R_2$ to bond to the precursor included in the polymer.

The second pattern formation material comprises a base polymer including a first unit represented by Chemical Formula 2 and a second unit represented by Chemical Formula 3; and an acid generator:

Chemical Formula 2:

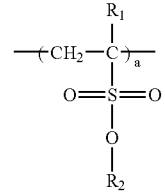

Chemical Formula 3:

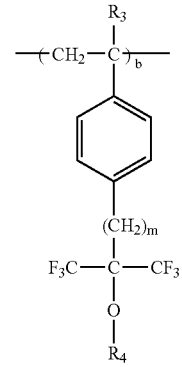

wherein $R_1$ and $R_3$ are the same or different and are a hydrogen atom, a chlorine atom, a fluorine atom, an alkyl group or an alkyl group including a fluorine atom; $R_2$ is a protecting group released by an acid; $R_4$ is an alkyl group, a cyclic aliphatic group, an aromatic group, a heterocycle, an ester group or an ether group; m is an integer of 0 through 5; and a and b satisfy $0<a<1$, $0<b<1$ and $0<a+b\leq1$.

In the second pattern formation material, since the base polymer includes the first unit, the transmittance of a resist film against light of a wavelength not longer than a 180 nm band is improved and the contrast in the solubility between an exposed portion and an unexposed portion of the resist film is improved in the same manner as in the first pattern formation material.

In particular, in the second pattern formation material, since the base polymer includes the second unit, the transmittance of the resist film against the light of a wavelength not longer than a 180 nm band is largely improved. Also, when $R_4$ is released from the second unit owing to the function of an acid, hexafluoroisopropyl alcohol is generated. Therefore, the solubility of the exposed portion of the resist film in a developer is largely improved, so that the contrast in the solubility between the exposed portion and the unexposed portion of the resist film can be largely improved. Furthermore, since the second unit has a benzene ring, resistance against dry etching is improved.

In the second pattern formation material, the base polymer can be prepared through radical polymerization of the first unit and the second unit.

In the second pattern formation material, the base polymer can be prepared by obtaining a polymer through radical polymerization of the first unit and a precursor obtained before substituting $R_4$ for the second unit and by allowing $R_4$ to bond to the precursor included in the polymer.

The third pattern formation material comprises a base polymer including a first unit represented by Chemical Formula 2 and a second unit represented by Chemical Formula 4; and an acid generator:

Chemical Formula 2:

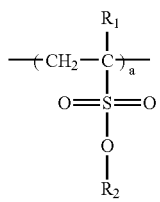

Chemical Formula 4:

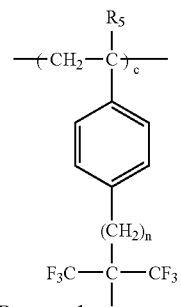

wherein $R_1$ and $R_5$ are the same or different and are a hydrogen atom, a chlorine atom, a fluorine atom, an alkyl group or an alkyl group including a fluorine atom; $R_2$ is a protecting group released by an acid; n is an integer of 0 through 5; and a and c satisfy $0<a<1$, $0<c<1$ and $0<a+c\leq1$.

In the third pattern formation material, since the base polymer includes the first unit, the transmittance of a resist film against the light of a wavelength not longer than a 180 nm band is improved and the contrast in the solubility between an exposed portion and an unexposed portion of the resist film is improved in the same manner as in the first pattern formation material.

In particular, in the third pattern formation material, since the base polymer includes the second unit, the transmittance of the resist film against the light of a wavelength not longer than a 180 nm band is largely improved. Also, since the second unit has hexafluoroisopropyl alcohol, the solubility of the exposed portion of the resist film in a developer is improved, so that the contrast in the solubility between the exposed portion and the unexposed portion of the resist film can be largely improved, and the wettability of the resist film can be improved so as to improve adhesion between the resist film and a substrate. Furthermore, since the second unit has a benzene ring, the resistance against dry etching is improved.

In the third pattern formation material, the base polymer can be prepared through radical polymerization of the first unit and the second unit.

In the third pattern formation material, the base polymer can be prepared by obtaining a polymer through radical polymerization of a precursor obtained before substituting $R_2$ for the first unit and the second unit and by allowing $R_2$ to bond to the precursor included in the polymer.

The fourth pattern formation material comprises a base polymer including a first unit represented by Chemical Formula 2, a second unit represented by Chemical Formula 3 and a third unit represented by Chemical Formula 4; and an acid generator:

Chemical Formula 2:

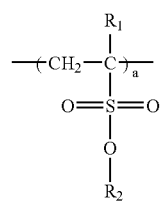

Chemical Formula 3:

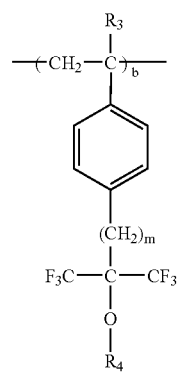

Chemical Formula 4:

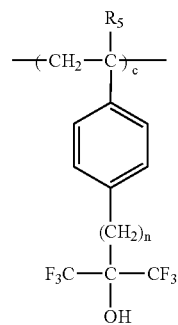

wherein $R_1$, $R_3$ and $R_5$ are the same or different and are a hydrogen atom, a chlorine atom, a fluorine atom, an alkyl group or an alkyl group including a fluorine atom; $R_2$ is a protecting group released by an acid; $R_4$ is an alkyl group, a cyclic aliphatic group, an aromatic group, a heterocycle, an ester group or an ether group; m and n are integers of 0 through 5; and a, b and c satisfy $0<a<1$, $0<b<1$, $0<c<1$ and $0<a+b+c\leq1$.

In the fourth pattern formation material, since the base polymer includes the first unit, the transmittance of a resist film against the light of a wavelength not longer than a 180 nm band is improved and the contrast in the solubility between an exposed portion and an unexposed portion of the resist film is improved in the same manner as in the first pattern formation material.

In particular, in the fourth pattern formation material, since the base polymer includes the second unit and the third unit, the characteristics of the second pattern formation material and the characteristics of the third pattern formation material are both exhibited. Therefore, the transmittance of the resist film against the light of a wavelength not longer than a 180 nm band and the contrast in the solubility between the exposed portion and the unexposed portion of the resist film are further improved, the adhesion between the resist film and a substrate is improved, and the resistance against dry etching is largely improved.

In the fourth pattern formation material, the base polymer can be prepared through radical polymerization of the first unit, the second unit and the third unit.

In the fourth pattern formation material, the base polymer can be prepared by obtaining a polymer through radical polymerization of the first unit and the third unit and by substituting $R_4$ for some of H of OH groups of the third unit included in the polymer.

The fifth pattern formation material comprises a base polymer including a first unit represented by Chemical Formula 2 and a second unit represented by Chemical Formula 5; and an acid generator:

Chemical Formula 2:

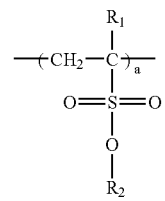

Chemical Formula 5:

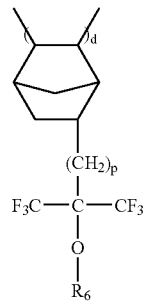

wherein $R_1$ is a hydrogen atom, a chlorine atom, a fluorine atom, an alkyl group or an alkyl group including a fluorine atom; $R_2$ is a protecting group released by an acid; $R_6$ is an alkyl group, a cyclic aliphatic group, an aromatic group, a heterocycle, an ester group or an ether group; p is an integer of 0 through 5; and a and d satisfy $0<a<1$, $0<d<1$ and $0<a+d\leq1$.

In the fifth pattern formation material, since the base polymer includes the first unit, the transmittance of a resist film against the light of a wavelength not longer than a 180 nm band is improved and the contrast in the solubility between an exposed portion and an unexposed portion of the resist film is improved in the same manner as in the first pattern formation material.

In particular, in the fifth pattern formation material, since the base polymer includes the second unit, namely, a norbornene ring, the transmittance of the resist film against the light of a wavelength not longer than a 180 nm band is further improved. Also, when $R_6$ is released from the second unit owing to the function of an acid, hexafluoroisopropyl alcohol is generated. Therefore, the solubility of the exposed portion of the resist film in a developer can be improved, so that the contrast in the solubility between the exposed portion and the unexposed portion of the resist film can be further improved. Moreover, since the second unit has a norbornene ring, the resistance against dry etching is improved.

In the fifth formation material, the base polymer can be prepared through radical polymerization of the first unit and the second unit.

In the fifth pattern formation material, the base polymer can be prepared by obtaining a polymer through radical polymerization of the first unit and a precursor obtained before substituting $R_6$ for the second unit and by allowing $R_6$ to bond to the precursor included in the polymer.

The sixth pattern formation material comprises a base polymer including a first unit represented by Chemical Formula 2 and a second unit represented by Chemical Formula 6; and an acid generator:

Chemical Formula 2:

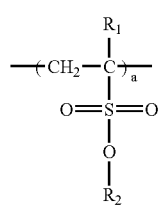

Chemical Formula 6:

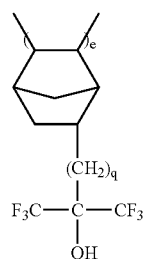

wherein $R_1$ is a hydrogen atom, a chlorine atom, a fluorine atom, an alkyl group or an alkyl group including a fluorine atom; $R_2$ is a protecting group released by an acid; q is an integer of 0 through 5; and a and e satisfy $0<a<1$, $0<e<1$ and $0<a+e\leq1$.

In the sixth pattern formation material, since the base polymer includes the first unit, the transmittance of a resist film against the light of a wavelength not longer than a 180 nm band is improved and the contrast in the solubility between an exposed portion and an unexposed portion of the resist film is improved in the same manner as in the first pattern formation material.

In particular, in the sixth pattern formation material, since the base polymer includes the second unit, namely, a norbornene ring, the transmittance of the resist film against the light of a wavelength not longer than a 180 nm band is further improved. Also, since the second unit has hexafluoroisopropyl alcohol, the solubility of the exposed portion of the resist film in a developer is improved so that the contrast in the solubility between the exposed portion and the unexposed portion of the resist film can be largely improved, and the wettability of the resist film is improved so as to improve the adhesion between the resist film and a substrate. Furthermore, since the second unit has a norbornene ring, the resistance against dry etching is improved.

In the sixth pattern formation material, the base polymer can be prepared through radical polymerization of the first unit and the second unit.

In the sixth pattern formation material, the base polymer can be prepared by obtaining a polymer through radical polymerization of a precursor obtained before substituting $R_2$ for the first unit and the second unit and by allowing $R_2$ to bond to the precursor included in the polymer.

The seventh pattern formation material comprises a base polymer including a first unit represented by Chemical Formula 2, a second unit represented by Chemical Formula 5 and a third unit represented by Chemical Formula 6; and an acid generator:

Chemical Formula 2:

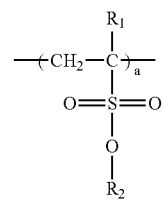

Chemical Formula 5:

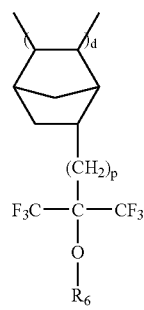

Chemical Formula 6:

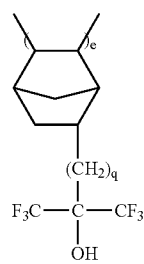

wherein $R_1$ is a hydrogen atom, a chlorine atom, a fluorine atom, an alkyl group or an alkyl group including a fluorine atom; $R_2$ is a protecting group released by an acid; $R_6$ is an alkyl group, a cyclic aliphatic group, an aromatic group, a heterocycle, an ester group or an ether group; p and q are integers of 0 through 5; and a, d and e satisfy $0<a<1$, $0<d<1$, $0<e<1$ and $0<a+d+e\leq1$.

In the seventh pattern formation material, since the base polymer includes the first unit, the transmittance of a resist film against the light of a wavelength not longer than a 180 nm band is improved and the contrast in the solubility between an exposed portion and an unexposed portion of the resist film is improved in the same manner as in the first pattern formation material.

In particular, in the seventh pattern formation material, since the base polymer includes the second unit and the third unit, the characteristics of the fifth pattern formation material and the characteristics of the sixth pattern formation material are both exhibited. Therefore, the transmittance of the resist film against the light of a wavelength not longer than a 180 nm band and the contrast in the solubility between the exposed portion and the unexposed portion of the resist film are further improved, the adhesion between the resist film and a substrate is improved, and the resistance against dry etching is largely improved.

In the seventh pattern formation material, the base polymer can be prepared through radical polymerization of the first unit, the second unit and the third unit.

In the seventh pattern formation material, the base polymer can be prepared by obtaining a polymer through radical polymerization of the first unit and the third unit and by substituting $R_6$ for some of H of OH groups of the third unit included in the polymer.

The first pattern formation method comprises the steps of forming a resist film by applying, on a substrate, the first pattern formation material; irradiating the resist film with exposing light of a wavelength not longer than a 180 nm band for pattern exposure; and forming a resist pattern by developing the resist film after the pattern exposure.

In the first pattern formation method, since the first pattern formation material is used, the transmittance of the resist film against light of a wavelength not longer than a 180 nm band is improved and the contrast in the solubility between an exposed portion and an unexposed portion of the resist film is improved.

The second pattern formation method comprises the steps of forming a resist film by applying, on a substrate, the second pattern formation material; irradiating the resist film with exposing light of a wavelength not longer than a 180 nm band for pattern exposure; and forming a resist pattern by developing the resist film after the pattern exposure.

In the second pattern formation method, since the second pattern formation material is used, the transmittance of the resist film against the light of a wavelength not longer than a 180 nm band and the contrast in the solubility between an exposed portion and an unexposed portion of the resist film are largely improved, and the resistance against dry etching is improved.

The third pattern formation method comprises the steps of forming a resist film by applying, on a substrate, the third pattern formation material; irradiating the resist film with exposing light of a wavelength not longer than a 180 nm band for pattern exposure; and forming a resist pattern by developing the resist film after the pattern exposure.

In the third pattern formation method, since the third pattern formation material is used, the transmittance of the resist film against the light of a wavelength not longer than a 180 nm band and the contrast in the solubility between an exposed portion and an unexposed portion of the resist film are largely improved, and the adhesion between the resist film and the substrate and the resistance against dry etching are improved.

The fourth pattern formation method comprises the steps of forming a resist film by applying, on a substrate, the fourth pattern formation material; irradiating the resist film with exposing light of a wavelength not longer than a 180 nm band for pattern exposure; and forming a resist pattern by developing the resist film after the pattern exposure.

In the fourth pattern formation method, since the fourth pattern formation material is used, the transmittance of the resist film against the light of a wavelength not longer than a 180 nm band and the contrast in the solubility between an exposed portion and an unexposed portion of the resist film are further improved, the adhesion between the resist film and the substrate is improved, and the resistance against dry etching is largely improved.

The fifth pattern formation method comprises the steps of forming a resist film by applying, on a substrate, the fifth pattern formation material; irradiating the resist film with exposing light of a wavelength not longer than a 180 nm band for pattern exposure; and forming a resist pattern by developing the resist film after the pattern exposure.

In the fifth pattern formation method, since the fifth pattern formation material is used, the transmittance of the resist film against the light of a wavelength not longer than a 180 nm band and the contrast in the solubility between an exposed portion and an unexposed portion of the resist film are largely improved, and the resistance against dry etching is improved.

The sixth pattern formation method comprises the steps of forming a resist film by applying, on a substrate, the sixth pattern formation material; irradiating the resist film with exposing light of a wavelength not longer than a 180 nm band for pattern exposure; and forming a resist pattern by developing the resist film after the pattern exposure.

In the sixth pattern formation method, since the sixth pattern formation material is used, the transmittance of the resist film against the light of a wavelength not longer than a 180 nm band and the contrast in the solubility between an exposed portion and an unexposed portion of the resist film are largely improved, and the adhesion between the resist film and the substrate and the resistance against dry etching are improved.

The seventh pattern formation method comprises the steps of forming a resist film by applying, on a substrate, the seventh pattern formation material; irradiating the resist film with exposing light of a wavelength not longer than a 180 nm band for pattern exposure; and forming a resist pattern by developing the resist film after the pattern exposure.

In the seventh pattern formation method, since the seventh pattern formation material is used, the transmittance of the resist film against the light of a wavelength not longer than a 180 nm band and the contrast in the solubility between an exposed portion and an unexposed portion of the resist film are further improved, the adhesion between the resist film and the substrate is improved and the resistance against dry etching is largely improved.

In any of the first through seventh pattern formation methods, the exposing light can be light of a wavelength of a 110 nm through 180 nm band, such as a $Xe_2$ laser beam, a $F_2$ laser beam, a $Kr_2$ laser beam, an ArKr laser beam or an $Ar_2$ laser beam; a soft-X ray beam of a wavelength of a 1 nm through 30 nm band; or a hard-X ray beam of a wavelength not longer than a 1 nm band.

BEST MODE FOR CARRYING OUT THE INVENTION

Embodiment 1

A pattern formation material and a pattern formation method according to Embodiment 1 of the invention will now be described.

In Embodiment 1, the first pattern formation material and the first pattern formation method described in [Means for Solving Problems] are embodied, and the specific composition of a resist material is as follows:

Base polymer: a polymer represented by Chemical Formula 7

Acid generator: triphenylsulfonium triflate (5 wt % based on the base polymer)

Solvent: propylene glycol monomethyl ether acetate

Chemical Formula 7:

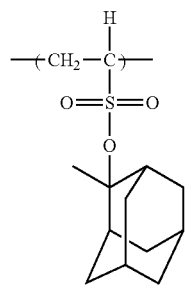

Chemical Formula 7 represents a specific example of the base polymer including the unit represented by Chemical Formula 1.

Although $R_1$ of the unit represented by Chemical Formula 1 is a hydrogen atom, it may be a chlorine atom, a fluorine atom, an alkyl group or an alkyl group including a fluorine atom instead.

Also, as $R_2$ of the unit represented by Chemical Formula 1, for example, any of protecting groups represented by Chemical Formula 8 may be widely used.

Chemical Formula 8:

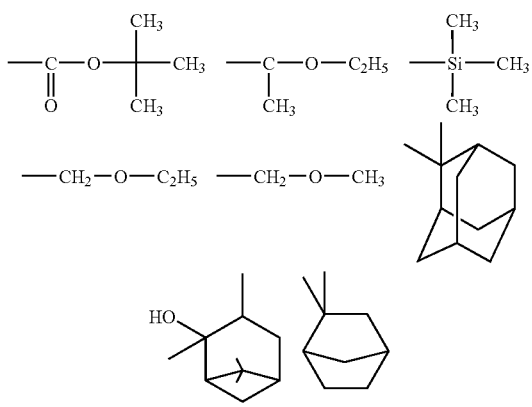

Now, a first synthesis method for the base polymer of the first pattern formation material will be described with reference to Chemical Formula 9.

Chemical Formula 9:

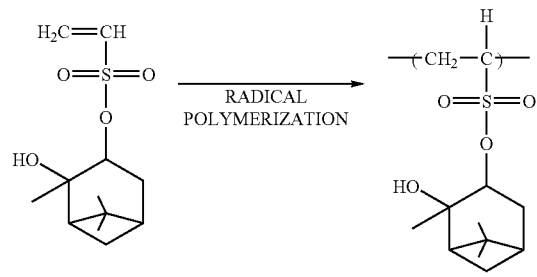

As represented by Chemical Formula 9, the base polymer of the first pattern formation material is prepared through radical polymerization of the unit represented by Chemical Formula 1. In this case, the unit can be easily radical polymerized.

Next, a second synthesis method for the base polymer of the first pattern formation material will be described with reference to Chemical Formula 10.

Chemical Formula 10:

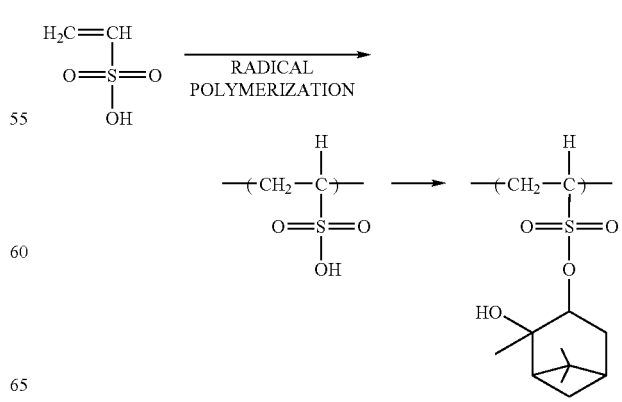

Specifically, as represented by Chemical Formula 10, a copolymer is obtained through radical polymerization of precursors each obtained before substituting $R_2$ for the unit represented by Chemical Formula 1, and $R_2$ is allowed to bond to the precursor included in the copolymer. In this case, the precursor of the unit can be easily radical polymerized.

Next, a third synthesis method for the base polymer of the first pattern formation material will be described with reference to Chemical Formula 11.

Chemical Formula 11:

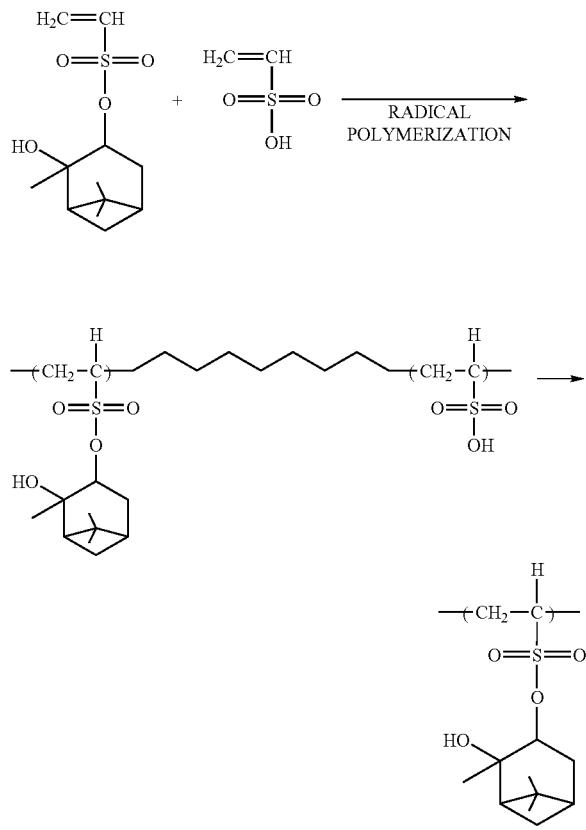

Specifically, as represented by Chemical Formula 11, a copolymer is obtained through the radical polymerization of the unit represented by Chemical Formula 1 and a precursor obtained before substituting $R_2$ for the unit represented by Chemical Formula 1, and $R_2$ is allowed to bond to the precursor included in the copolymer. In this case, the unit and the precursor of the unit can be easily radical polymerized.

Now, the pattern formation method of Embodiment 1 will be described with reference to FIGS. 1(a) through 1(d).

Figure 1:
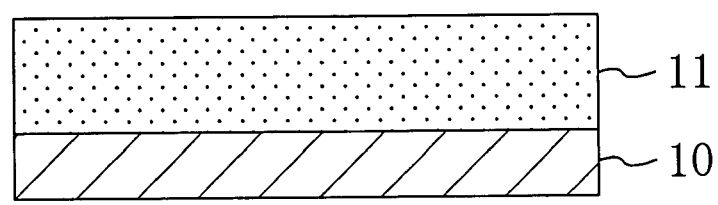
FIGS. 1(a) through 1(d) are cross-sectional views for showing procedures in a pattern formation method according to any of Embodiments 1 through 7 of the invention.
Figure 1:
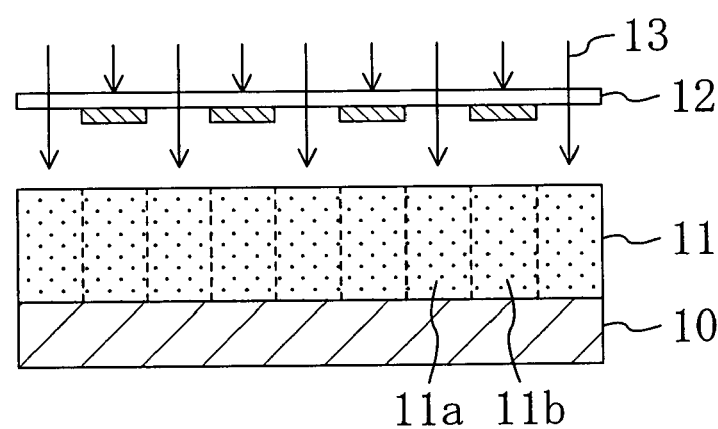
Figure 1:
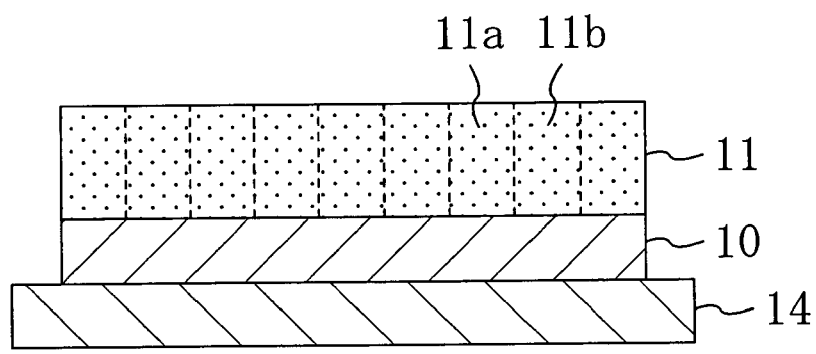
Figure 1:
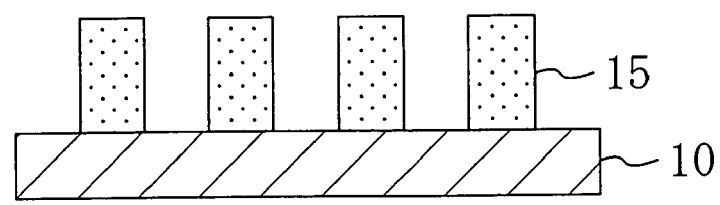
Figure 2:
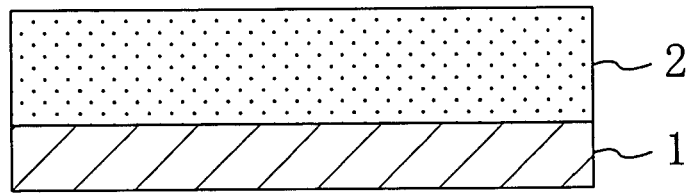
FIGS. 2(a) through 2(d) are cross-sectional views for showing procedures in a conventional pattern formation method.
Figure 2:
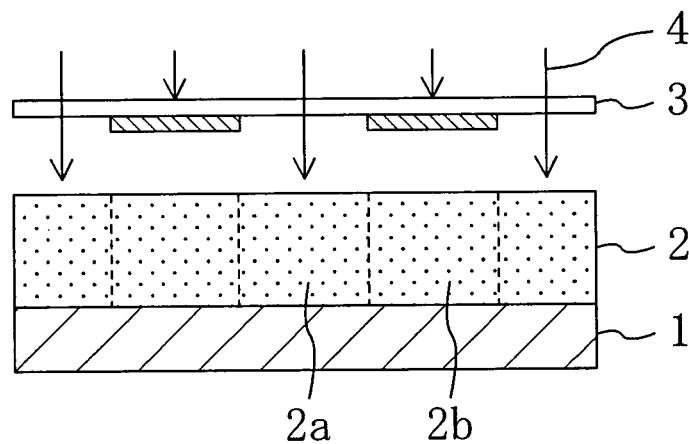
Figure 2:
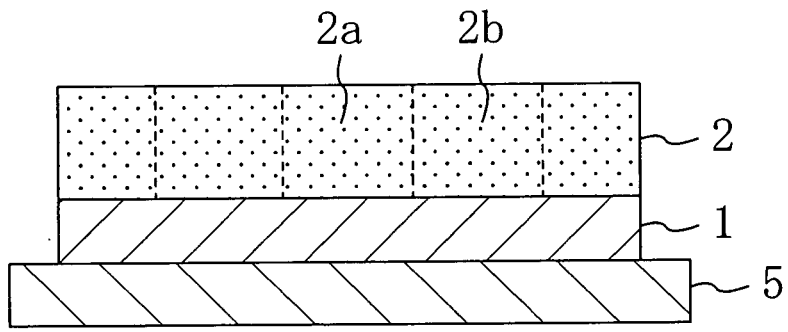
Figure 2:
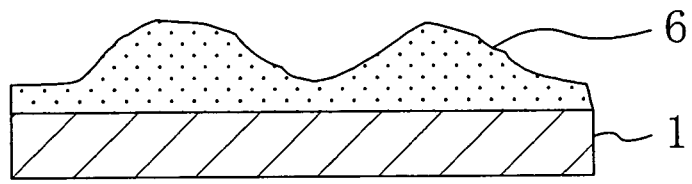

First, as shown in FIG. 1(a), the resist material having the above-described composition is applied on a semiconductor substrate 10 by spin coating, thereby forming a resist film 11 with a thickness of 0.2 μm. At this point, since the base polymer is alkali-insoluble, the resist film 11 is alkali-insoluble.

Next, as shown in FIG. 1(b), the resist film 11 is subjected to pattern exposure by irradiating through a mask 12 with a $F_2$ excimer laser beam 13 (wavelength: a 157 nm band).

Thus, an acid is generated from the acid generator in an exposed portion 11a of the resist film 11 while no acid is generated in an unexposed portion 11b of the resist film 11.

Then, as shown in FIG. 1(c), the semiconductor substrate 10 together with the resist film 11 is heated with a hot plate 14. Thus, the base polymer is heated in the presence of the acid in the exposed portion 11a of the resist film 11, so as to release the protecting group of Chemical Formula 7. As a result, the base polymer becomes alkali-soluble.

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 can be formed from the unexposed portion 11b of the resist film 11 as shown in FIG. 1(d).

Embodiment 2

A pattern formation material and a pattern formation method according to Embodiment 2 of the invention will now be described. Embodiment 2 is different from Embodiment 1 in the resist material alone, and hence, the resist material alone will be herein described.

In Embodiment 2, the second pattern formation material and the second pattern formation method described in [Means for Solving Problems] are embodied, and the specific composition of the resist material is as follows:

Base polymer: a polymer represented by Chemical Formula 12

Acid generator: triphenylsulfonium triflate (5 wt % based on the base polymer)

Solvent: propylene glycol monomethyl ether acetate

Chemical Formula 12:

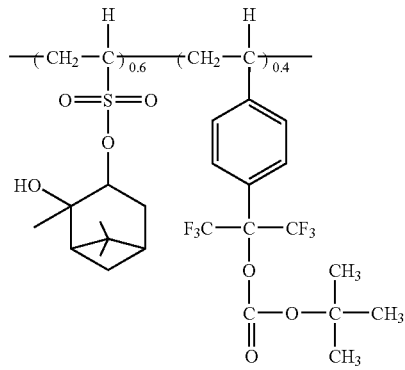

Chemical Formula 12 represents a specific example of the base polymer including the first unit represented by Chemical Formula 2 and the second unit represented by Chemical Formula 3.

Although $R_1$ of the first unit and $R_3$ of the second unit are both hydrogen atoms, they may be the same or different and may be a chlorine atom, a fluorine atom, an alkyl group or an alkyl group including a fluorine atom instead.

As $R_2$ of the first unit, for example, any of the protecting groups represented by Chemical Formula 8 may be widely used.

Also, as $R_4$ of the second unit, an alkyl group, a cyclic aliphatic group, an aromatic group, a heterocycle, an ester group or an ether group can be used. In this case, when $R_4$ of the second unit is a substituent group used in Chemical Formula 12, the substituent group is released by an acid.

Although m of the second unit is 0, it may be any integer of 1 through 5 instead.

Now, a first synthesis method for the second pattern formation material will be described with reference to Chemical Formula 13.

Chemical Formula 13:

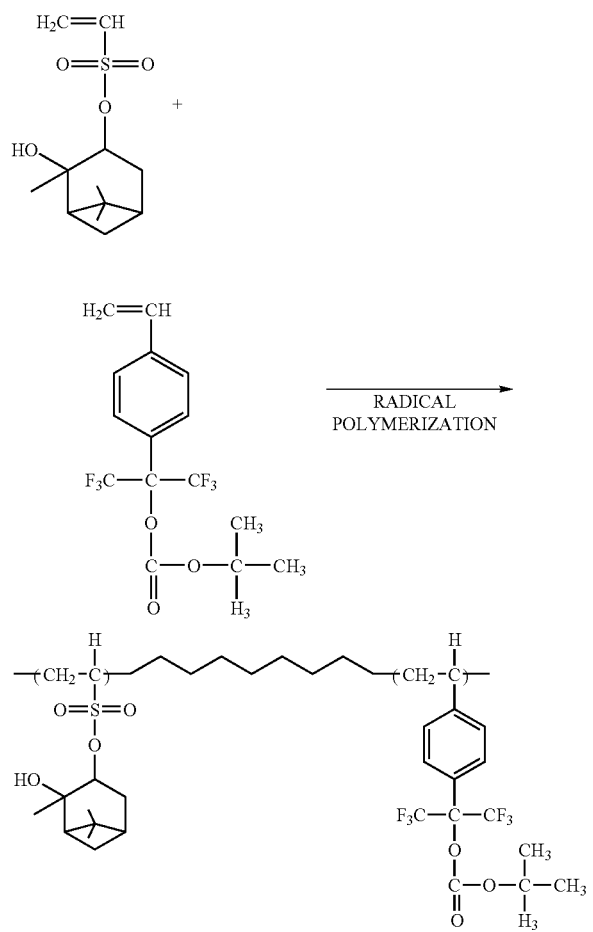

Specifically, as represented by Chemical Formula 13, the base polymer of the second pattern formation material is obtained through the radical polymerization of the first unit represented by Chemical Formula 2 and the second unit represented by Chemical Formula 3. In this case, the first unit and the second unit can be easily radical polymerized.

Next, a second synthesis method for the second pattern formation material will be described with reference to Chemical Formula 14.

Chemical Formula 14:

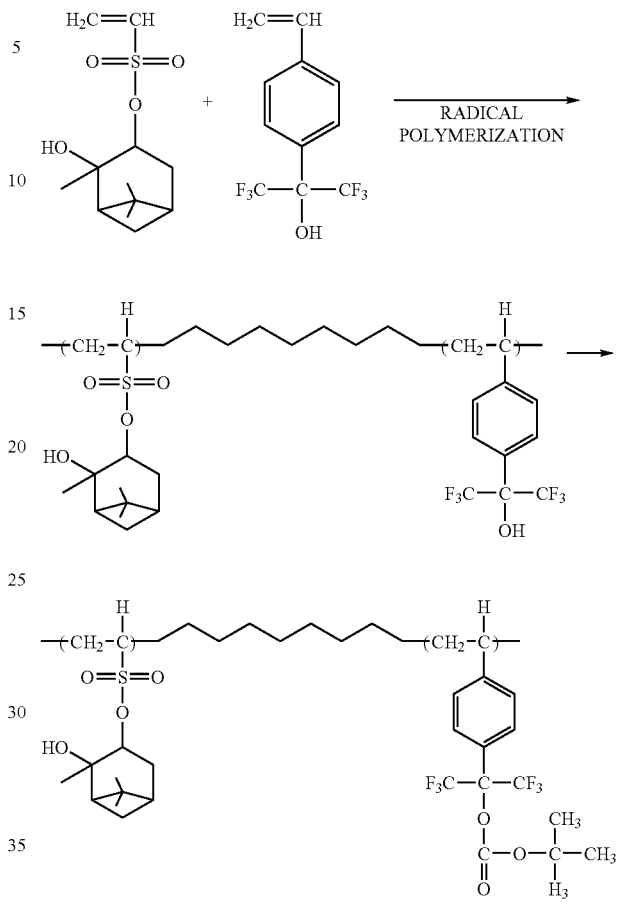

Specifically, as represented by Chemical Formula 14, a copolymer is obtained through the radical polymerization of the first unit represented by Chemical Formula 2 and a precursor obtained before substituting $R_4$ for the second unit represented by Chemical Formula 3, and $R_4$ is allowed to bond to the precursor included in the copolymer. In this case, the first unit and the precursor of the second unit can be easily radical polymerized.

Embodiment 3

A pattern formation material and a pattern formation method according to Embodiment 3 of the invention will now be described. Embodiment 3 is different from Embodiment 1 in the resist material alone, and hence, the resist material alone will be herein described.

In Embodiment 3, the third pattern formation material and the third pattern formation method described in [Means for Solving Problems] are embodied, and the specific composition of the resist material is as follows:

Base polymer: a polymer represented by Chemical Formula 15

Acid generator: triphenylsulfonium triflate (5 wt % based on the base polymer)

Solvent: propylene glycol monomethyl ether acetate

Chemical Formula 15:

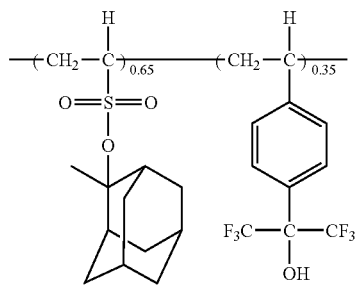

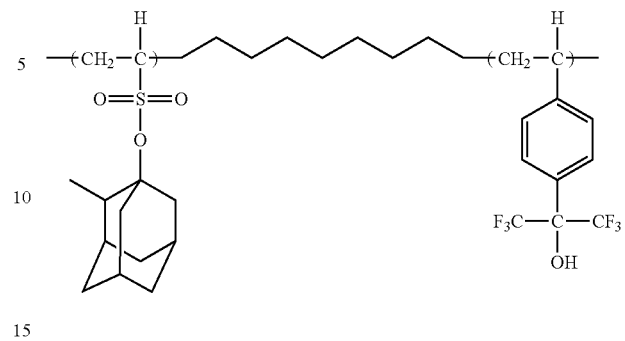

Chemical Formula 15 represents a specific example of the base polymer including the first unit represented by Chemical Formula 2 and the second unit represented by Chemical Formula 4.

Although $R_1$ of the first unit and $R_5$ of the second unit are both hydrogen atoms, they may be the same or different and may be a chlorine atom, a fluorine atom, an alkyl group or an alkyl group including a fluorine atom instead.

As $R_2$ of the first unit, for example, any of the protecting groups represented by Chemical Formula 8 may be widely used.

Also, although n of the second unit is 0, it may be any integer of 1 through 5 instead.

Now, a first synthesis method for the third pattern formation material will be described with reference to Chemical Formula 16.

Chemical Formula 16:

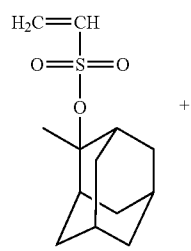

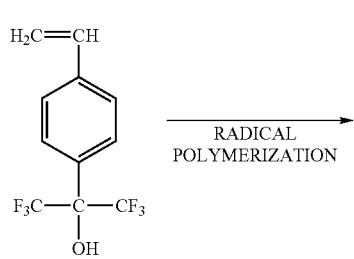

Specifically, as represented by Chemical Formula 16, the base polymer of the third pattern formation material is obtained through the radical polymerization of the first unit represented by Chemical Formula 2 and the second unit represented by Chemical Formula 4. In this case, the first unit and the second unit can be easily radical polymerized.

Next, a second synthesis method for the third pattern formation material will be described with reference to Chemical Formula 17.

Chemical Formula 17:

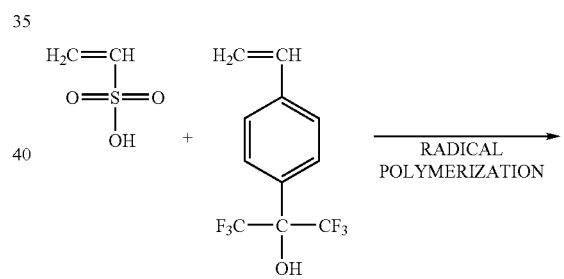

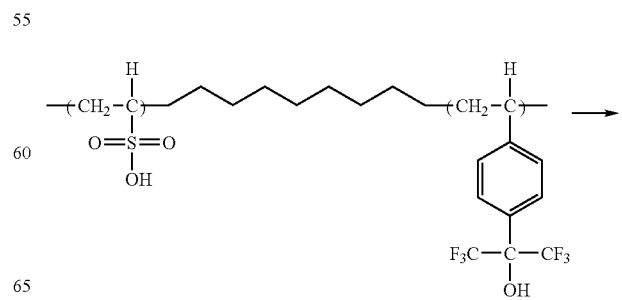

-continued

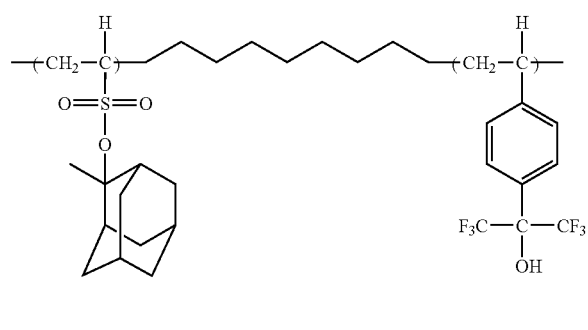

Specifically, as represented by Chemical Formula 17, a copolymer is obtained through the radical polymerization of a precursor obtained before substituting $R_2$ for the first unit represented by Chemical Formula 2 and the second unit represented by Chemical Formula 4, and $R_2$ is allowed to bond to the precursor included in the copolymer. In this case, the precursor of the first unit and the second unit can be easily radical polymerized.

Embodiment 4

A pattern formation material and a pattern formation method according to Embodiment 4 of the invention will now be described. Embodiment 4 is different from Embodiment 1 in the resist material alone, and hence, the resist material alone will be herein described.

In Embodiment 4, the fourth pattern formation material and the fourth pattern formation method described in [Means for Solving Problems] are embodied, and the specific composition of the resist material is as follows:

Base polymer: a polymer represented by Chemical Formula 18

Acid generator: triphenylsulfonium triflate (5 wt % based on the base polymer)

Solvent: propylene glycol monomethyl ether acetate
Chemical Formula 18:

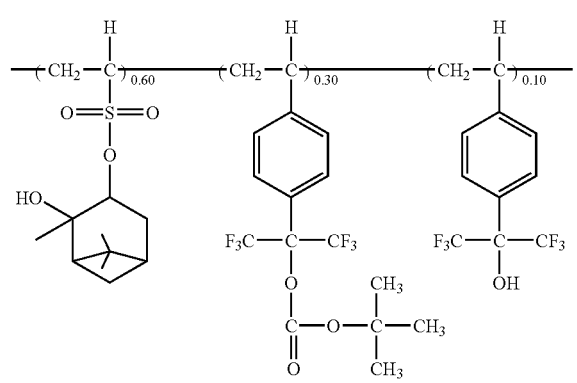

Chemical Formula 18 represents a specific example of the base polymer including the first unit represented by Chemical Formula 2, the second unit represented by Chemical Formula 3 and the third unit represented by Chemical Formula 4.

Although $R_1$ of the first unit, $R_3$ of the second unit and $R_5$ of the third unit are all hydrogen atoms, they may be the same or different and may be a chlorine atom, a fluorine atom, an alkyl group or an alkyl group including a fluorine atom instead.

As $R_2$ of the first unit, for example, any of the protecting groups represented by Chemical Formula 8 may be widely used.

Also, as $R_4$ of the third unit, an alkyl group, a cyclic aliphatic group, an aromatic group, a heterocycle, an ester group or an ether group can be used. In this case, when $R_4$ of the second unit is a substituent group used in Chemical Formula 18, the substituent group is released by an acid.

Also, although m of the second unit is 0, it may be any integer of 1 through 5 instead.

Furthermore, although n of the third unit is 0, it may be any integer of 1 through 5.

Now, a first synthesis method for the fourth pattern formation material will be described with reference to Chemical Formula 19.

Chemical Formula 19:

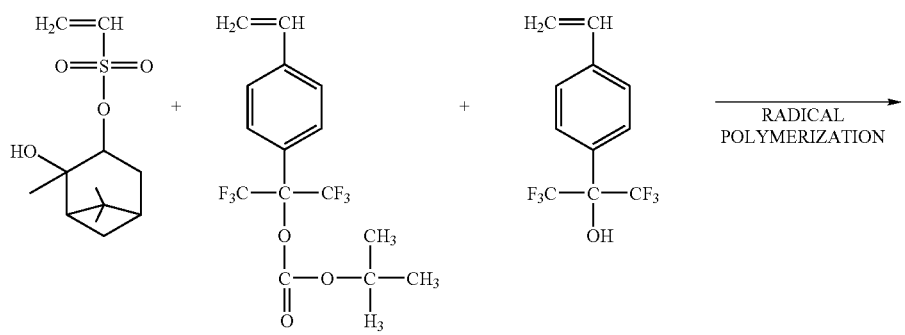

-continued

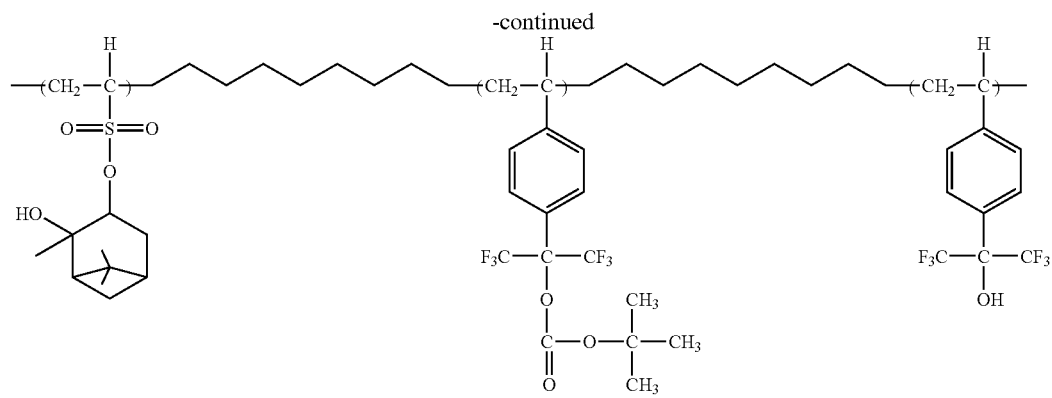

Specifically, as represented by Chemical Formula 19, the base polymer of the fourth pattern formation material is obtained through the radical polymerization of the first unit represented by Chemical Formula 2, the second unit represented by Chemical Formula 3 and the third unit represented by Chemical Formula 4. In this case, the first unit, the second unit and the third unit can be easily radical polymerized.

Next, a second synthesis method for the fourth pattern formation material will be described with reference to Chemical Formula 20.

Chemical Formula 20:

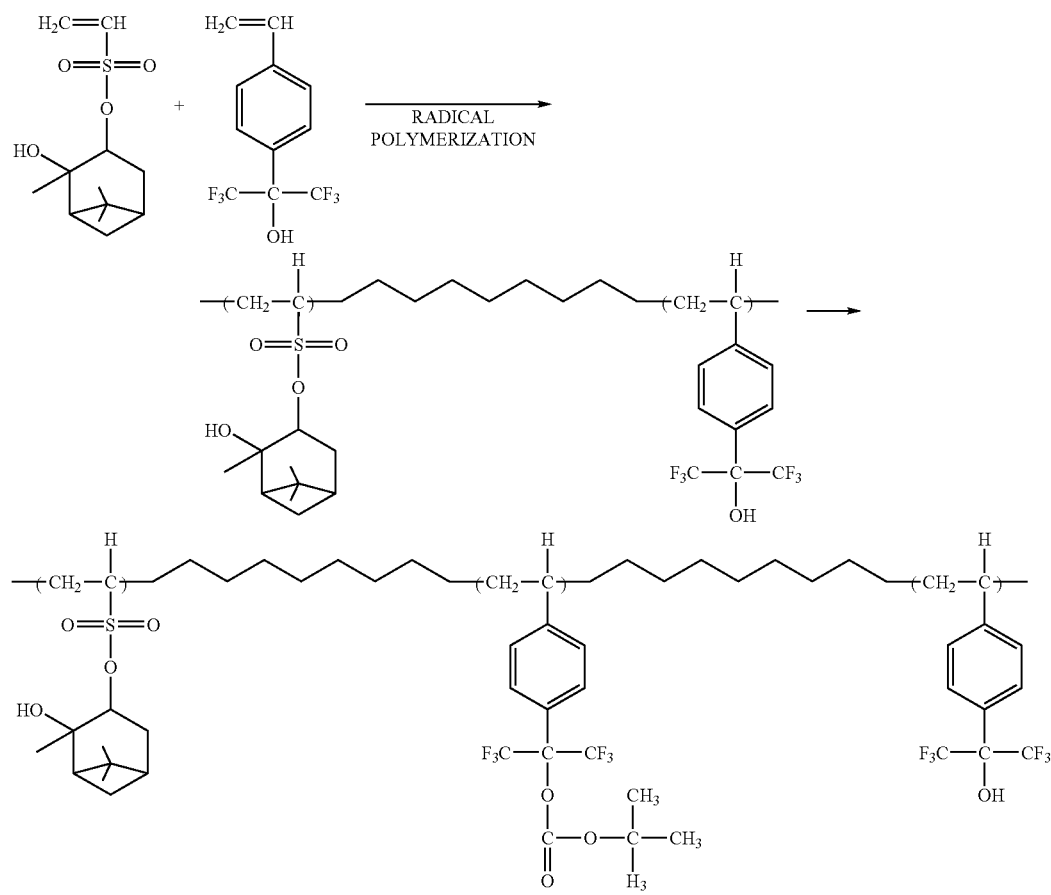

Specifically, a copolymer is obtained through the radical polymerization of the first unit represented by Chemical Formula 2 and the third unit represented by Chemical Formula 4, and $R_4$ is substituted for some of H of OH groups of the third unit included in the copolymer. In this case, the first unit and the third unit can be easily radical polymerized.

Embodiment 5

A pattern formation material and a pattern formation method according to Embodiment 5 of the invention will now be described. Embodiment 5 is different from Embodiment 1 in the resist material alone, and hence, the resist material alone will be herein described.

In Embodiment 5, the fifth pattern formation material and the fifth pattern formation method described in [Means for Solving Problems] are embodied, and the specific composition of the resist material is as follows:

Base polymer: a polymer represented by Chemical Formula 21

Acid generator: triphenylsulfonium triflate (5 wt % based on the base polymer)

Solvent: propylene glycol monomethyl ether acetate

Chemical Formula 21:

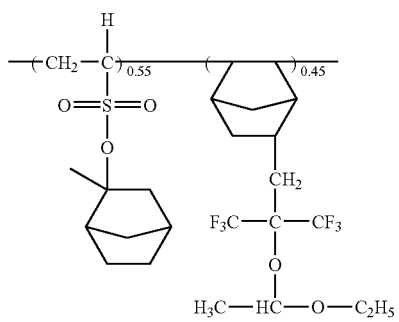

Chemical Formula 21 represents a specific example of the base polymer including the first unit represented by Chemical Formula 2 and the second unit represented by Chemical Formula 5.

Although $R_1$ of the first unit is a hydrogen atom, it may be a chlorine atom, a fluorine atom, an alkyl group or an alkyl group including a fluorine atom instead.

As $R_2$ of the first unit, for example, any of the protecting groups represented by Chemical Formula 8 may be widely used.

Also, as $R_6$ of the second unit, an alkyl group, a cyclic aliphatic group, an aromatic group, a heterocycle, an ester group or an ether group can be used.

Also, although p of the second unit is 1, it may be 0 or any integer of 2 through 5 instead.

Now, a first synthesis method for the fifth pattern formation material will be described with reference to Chemical Formula 22.

Chemical Formula 22:

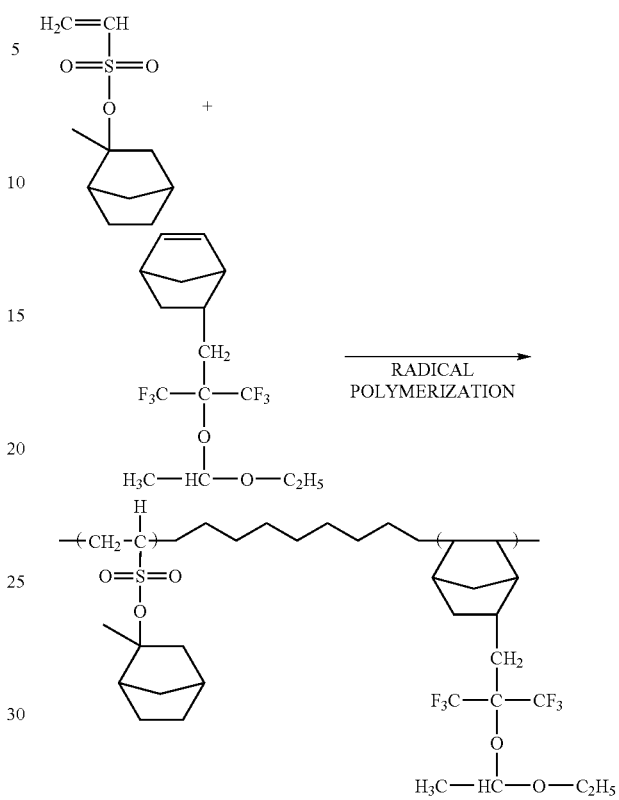

Specifically, as represented by Chemical Formula 22, the base polymer of the fifth pattern formation material is obtained through the radical polymerization of the first unit represented by Chemical Formula 2 and the second unit represented by Chemical Formula 5. In this case, the first unit and the second unit can be easily radical polymerized.

Next, a second synthesis method for the fifth pattern formation material will be described with reference to Chemical Formula 23.

Chemical Formula 23:

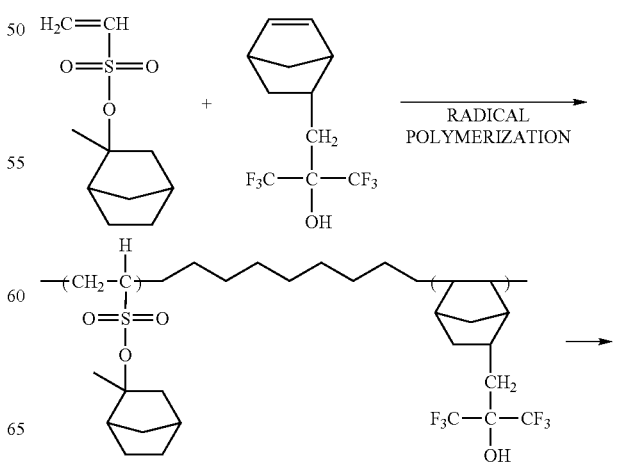

-continued

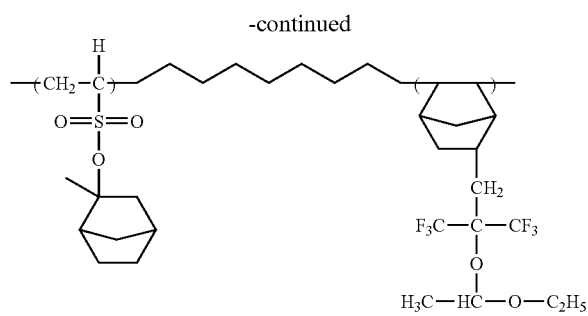

Specifically, as represented by Chemical Formula 23, a copolymer is obtained through the radical polymerization of the first unit represented by Chemical Formula 2 and a precursor obtained before substituting $R_6$ for the second unit represented by Chemical Formula 5, and $R_6$ is allowed to bond to the precursor included in the copolymer. In this case, the first unit and the precursor of the second unit can be easily radical polymerized.

Embodiment 6

A pattern formation material and a pattern formation method according to Embodiment 6 of the invention will now be described. Embodiment 6 is different from Embodiment 1 in the resist material alone, and hence, the resist material alone will be herein described.

In Embodiment 6, the sixth pattern formation material and the sixth pattern formation method described in [Means for Solving Problems] are embodied, and the specific composition of the resist material is as follows:

Base polymer: a polymer represented by Chemical Formula 24

Acid generator: triphenylsulfonium triflate (5 wt % based on the base polymer)

Solvent: propylene glycol monomethyl ether acetate

Chemical Formula 24:

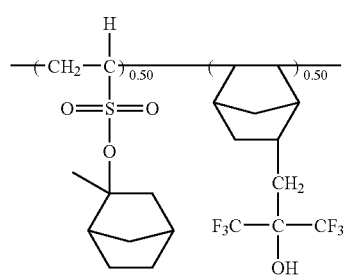

Chemical Formula 24 represents a specific example of the base polymer including the first unit represented by Chemical Formula 2 and the second unit represented by Chemical Formula 6.

Although $R_1$ of the first unit is a hydrogen atom, it may be a chlorine atom, a fluorine atom, an alkyl group or an alkyl group including a fluorine atom instead.

As $R_2$ of the first unit, for example, any of the protecting groups represented by Chemical Formula 8 may be widely used.

Also, although q of the second unit is 1, it may be 0 or any integer of 2 through 5 instead.

Now, a first synthesis method for the sixth pattern formation material will be described with reference to Chemical Formula 25.

Chemical Formula 25:

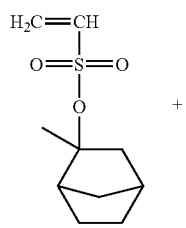

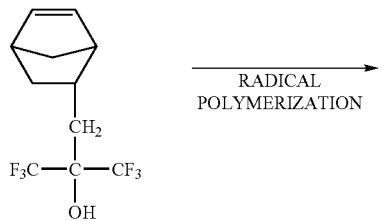

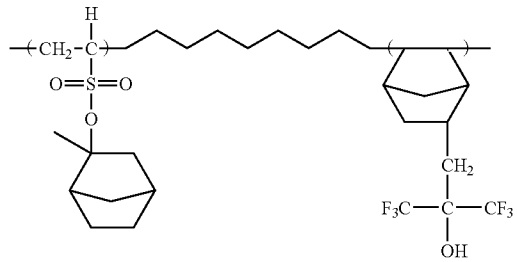

Specifically, as represented by Chemical Formula 25, the base polymer of the sixth pattern formation material is obtained through the radical polymerization of the first unit represented by Chemical Formula 2 and the second unit represented by Chemical Formula 6. In this case, the first unit and the second unit can be easily radical polymerized.

Next, a second synthesis method for the sixth pattern formation material will be described with reference to Chemical Formula 26.

Chemical Formula 26:

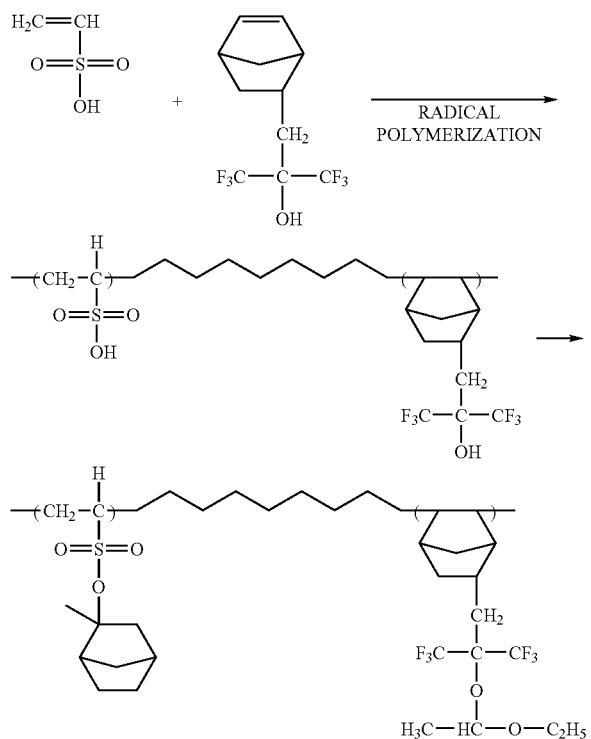

Specifically, as represented by Chemical Formula 26, a copolymer is obtained through the radical polymerization of a precursor obtained before substituting $R_2$ for the first unit represented by Chemical Formula 2 and the second unit represented by Chemical Formula 6, and $R_2$ is allowed to bond to the precursor included in the copolymer. In this case, the precursor of the first unit and the second unit can be easily radical polymerized.

Embodiment 7

A pattern formation material and a pattern formation method according to Embodiment 7 of the invention will now be described. Embodiment 7 is different from Embodiment 1 in the resist material alone, and hence, the resist material alone will be herein described.

In Embodiment 7, the seventh pattern formation material and the seventh pattern formation method described in [Means for Solving Problems] are embodied, and the specific composition of the resist material is as follows:

Base polymer: a polymer represented by Chemical Formula 27

Acid generator: triphenylsulfonium triflate (5 wt % based on the base polymer)

Solvent: propylene glycol monomethyl ether acetate

Chemical Formula 27:

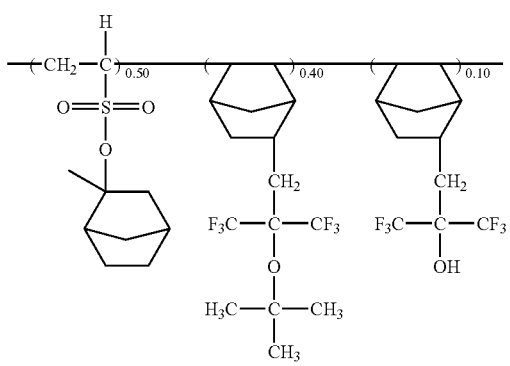

Chemical Formula 27 represents a specific example of the base polymer including the first unit represented by Chemical Formula 2, the second unit represented by Chemical Formula 5 and the third unit represented by Chemical Formula 6.

Although $R_1$ of the first unit is a hydrogen atom, it may be a chlorine atom, a fluorine atom, an alkyl group or an alkyl group including a fluorine atom instead.

As $R_2$ of the first unit, for example, any of the protecting groups represented by Chemical Formula 8 may be widely used.

Also, as $R_6$ of the second unit, an alkyl group, a cyclic aliphatic group, an aromatic group, a heterocycle, an ester group or an ether group can be used.

Also, although p of the second unit is 1, it may be 0 or any integer of 2 through 5 instead.

Furthermore, although q of the third unit is 1, it may be 0 or any integer of 2 through 5.

Now, a first synthesis method for the seventh pattern formation material will be described with reference to Chemical Formula 28.

Chemical Formula 28:

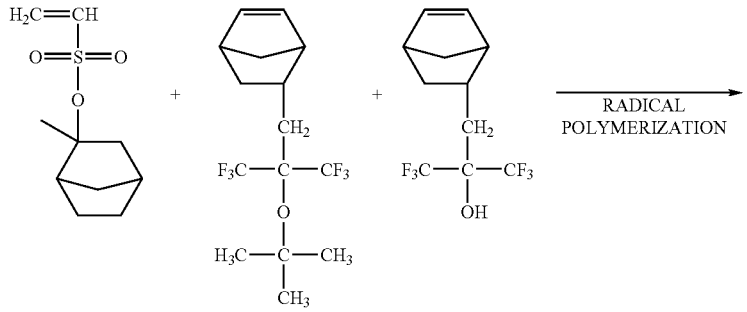

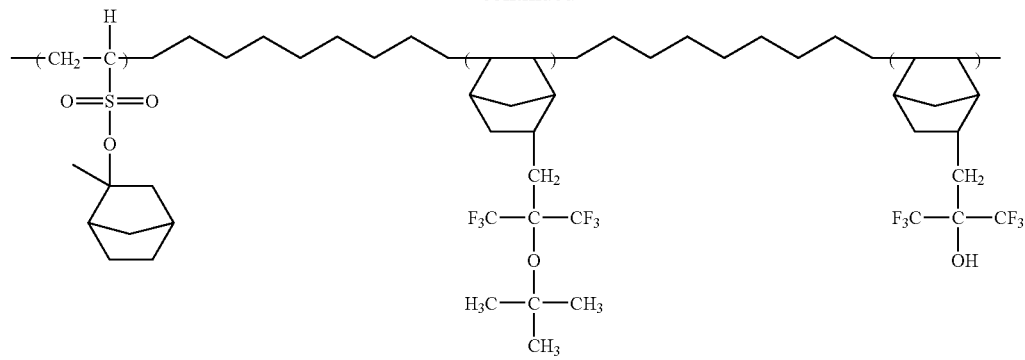

Specifically, as represented by Chemical Formula 28, the base polymer of the seventh pattern formation material is obtained through the radical polymerization of the first unit represented by Chemical Formula 2, the second unit represented by Chemical Formula 5 and the third unit represented by Chemical Formula 6. In this case, the first unit, the second unit and the third unit can be easily radical polymerized.

Next, a second synthesis method for the seventh pattern formation material will be described with reference to Chemical Formula 29.

Chemical Formula 29:

Specifically, as represented by Chemical Formula 29, a copolymer is obtained through the radical polymerization of the first unit represented by Chemical Formula 2 and the third unit represented by Chemical Formula 6, and $R_6$ is substituted for some of H of OH groups of the third unit included in the copolymer. In this case, the first unit and the second unit can be easily radical polymerized.

Although the $F_2$ laser beam is used as the exposing light in each of Embodiments 1 through 7, light of a wavelength of a 110 nm through 180 nm band, such as a $Xe_2$ laser beam, a $Kr_2$ laser beam, an ArKr laser beam, an $Ar_2$ laser beam; a

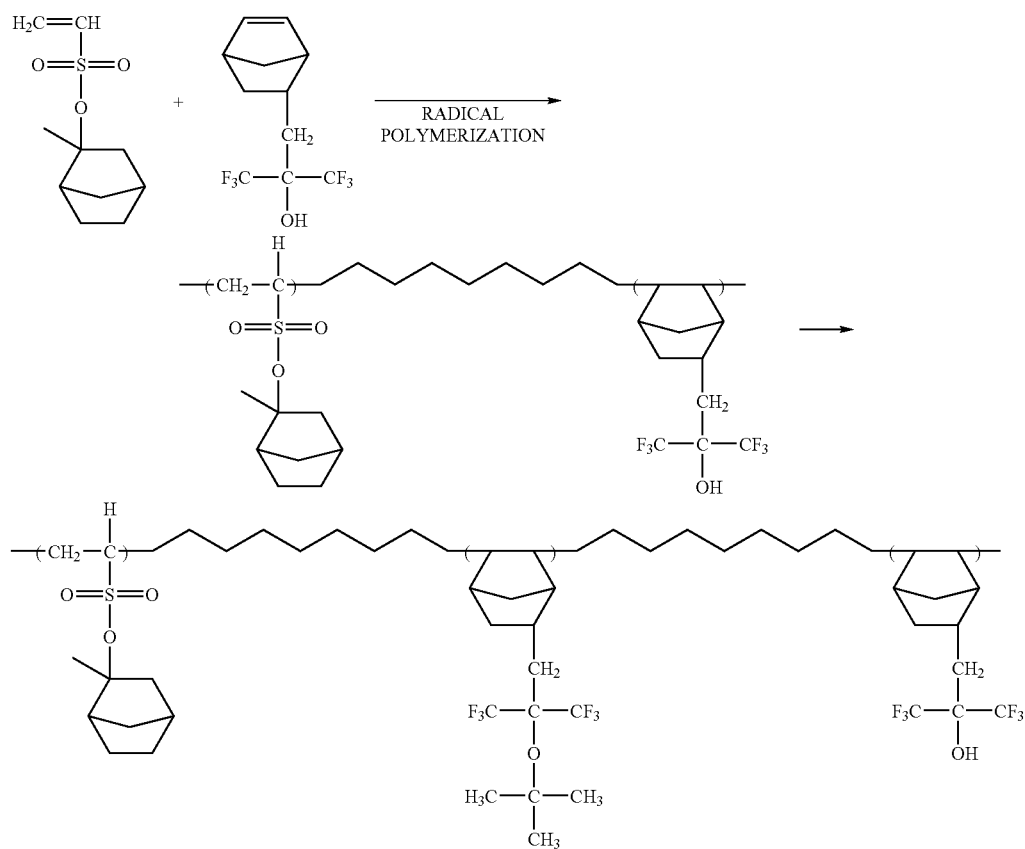

soft-X ray beam of a wavelength of a 1 nm through 30 nm band; or a hard-X ray beam of a wavelength not longer than a 1 nm band can be used instead.

INDUSTRIAL APPLICABILITY

The first through seventh pattern formation materials and the first through seventh pattern formation methods according to the invention improve the transmittance of a resist film against light of a wavelength not longer than a 180 nm band.

The invention claimed is:

1. A pattern formation material comprising:
a base polymer including a first unit represented by Chemical Formula 2 and a second unit represented by Chemical Formula 3; and
an acid generator:

Chemical Formula 2:

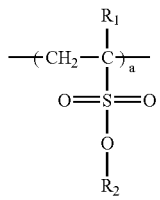

Chemical Formula 3:

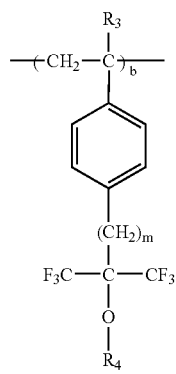

wherein $R_1$ and $R_3$ are the same or different and are a hydrogen atom, a chlorine atom, a fluorine atom, an alkyl group or an alkyl group including a fluorine atom; $R_2$ is a protecting group released by an acid and is any one of the following seven compounds;

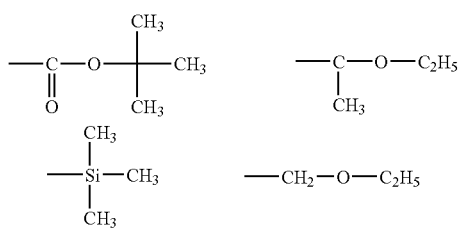

-continued

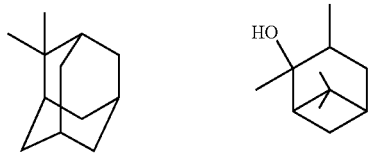

$R_4$ is an alkyl group, a cyclic aliphatic group, an aromatic group, a heterocycle, an ester group or an ether group; m is an integer of 0 through 5; and a and b satisfy $0<a<1$, $0<b<1$ and $0<a+b\leq 1$.

2. The pattern formation material of claim 1, wherein said base polymer is prepared through radical polymerization of said first unit and said second unit.

3. The pattern formation material of claim 1, wherein said base polymer is prepared by obtaining a polymer through radical polymerization of said first unit and a precursor obtained before substituting $R_4$ for the second unit and by allowing $R_4$ to bond to said precursor included in said polymer.

4. A pattern formation material comprising:
a base polymer including a first unit represented by Chemical Formula 2 and a second unit represented by Chemical Formula 4; and
an acid generator:

Chemical Formula 2:

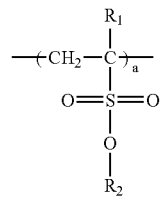

Chemical Formula 4:

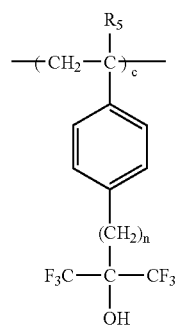

wherein $R_1$ and $R_5$ are the same or different and are a hydrogen atom, a chlorine atom, a fluorine atom, an alkyl group or an alkyl group including a fluorine atom; $R_2$ is a protecting group released by an acid and is any one of the following seven compounds;

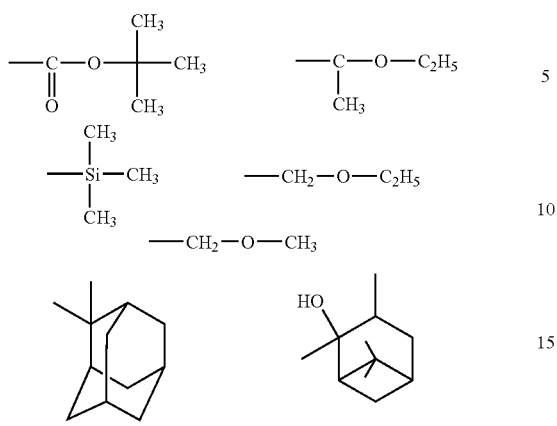

n is an integer of 0 through 5; and a and c satisfy 0<a<1, 0<c<1 and 0<a+c≦1.

5. The pattern formation material of claim 4,
wherein said base polymer is prepared through radical polymerization of said first unit and said second unit.

6. The pattern formation material of claim 4,
wherein said base polymer is prepared by obtaining a polymer through radical polymerization of a precursor obtained before substituting $R_2$ for said first unit and said second unit and by allowing $R_2$ to bond to said precursor included in said polymer.

7. A pattern formation material comprising:
a base polymer including a first unit represented by Chemical Formula 2, a second unit represented by Chemical Formula 3 and a third unit represented by Chemical Formula 4; and
an acid generator:

Chemical Formula 2:

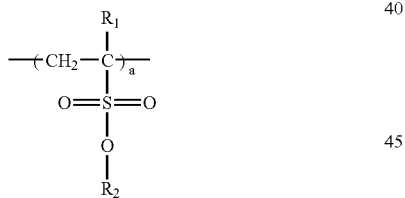

Chemical Formula 3:

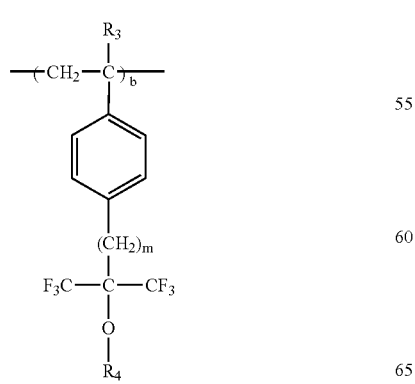

Chemical Formula 4:

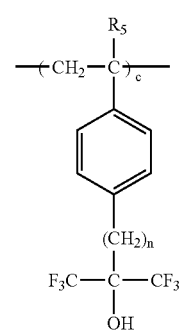

wherein $R_1$, $R_3$ and $R_5$ are the same or different and are a hydrogen atom, a chlorine atom, a fluorine atom, an alkyl group or an alkyl group including a fluorine atom; $R_2$ is a protecting group released by an acid and is any one of the following seven compounds;

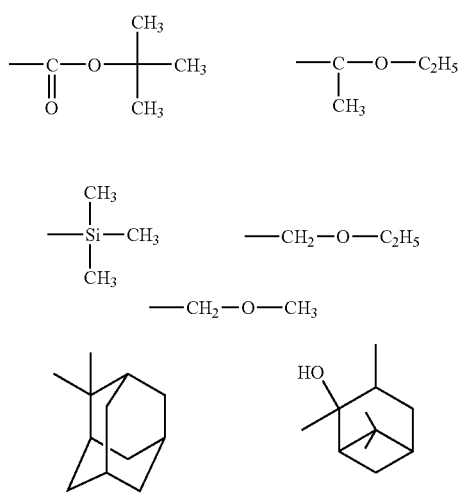

$R_4$ is an alkyl group, a cyclic aliphatic group, an aromatic group, a heterocycle, an ester group or an ether group; m and n are integers of 0 through 5; and a, b and c satisfy 0<a<1, 0<b<1, 0<c<1 and 0<a+b+c≦1.

8. The pattern formation material of claim 7,
wherein said base polymer is prepared through radical polymerization of said first unit, said second unit and said third unit.

9. The pattern formation material of claim 7,
wherein said base polymer is prepared by obtaining a polymer through radical polymerization of said first unit and said third unit and by substituting $R_4$ for some of H of OH groups of said third unit included in said polymer.

10. A pattern formation material comprising:
a base polymer including a first unit represented by Chemical Formula 2 and a second unit represented by Chemical Formula 5; and
an acid generator:

Chemical Formula 2

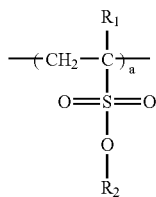

Chemical Formula 5:

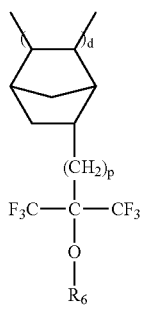

wherein $R_1$ is a hydrogen atom, a chlorine atom, a fluorine atom, an alkyl group or an alkyl group including a fluorine atom; $R_2$ is a protecting group released by an acid and is any one of the following seven compounds;

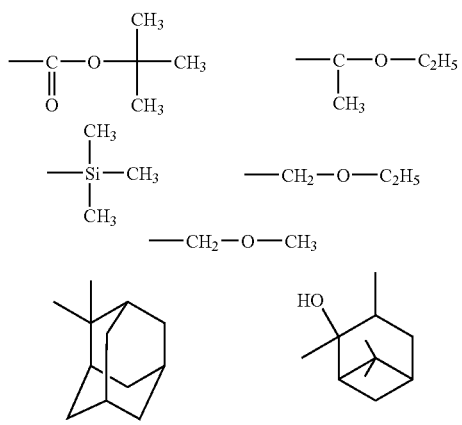

$R_6$ is an alkyl group, a cyclic aliphatic group, an aromatic group, a heterocycle, an ester group or an ether group; p is an integer of 0 through 5; and a and d satisfy $0<a<1$, $0<d<1$ and $0<a+d\leq 1$.

11. The pattern formation material of claim 10, wherein said base polymer is prepared through radical polymerization of said first unit and said second unit.

12. The pattern formation material of claim 10, wherein said base polymer is prepared by obtaining a polymer through radical polymerization of said first unit and a precursor obtained before substituting $R_6$ for said second unit and by allowing $R_6$ to bond to said precursor included in said polymer.

13. A pattern formation material comprising:
a base polymer including a first unit represented by Chemical Formula 2 and a second unit represented by Chemical Formula 6; and
an acid generator:

Chemical Formula 2:

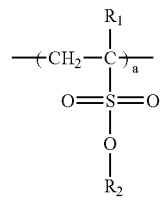

Chemical Formula 6:

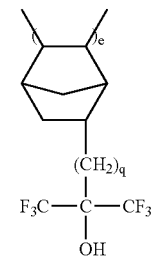

wherein $R_1$ is a hydrogen atom, a chlorine atom, a fluorine atom, an alkyl group or an alkyl group including a fluorine atom; $R_2$ is a protecting group released by an acid and is any one of the following seven compounds;

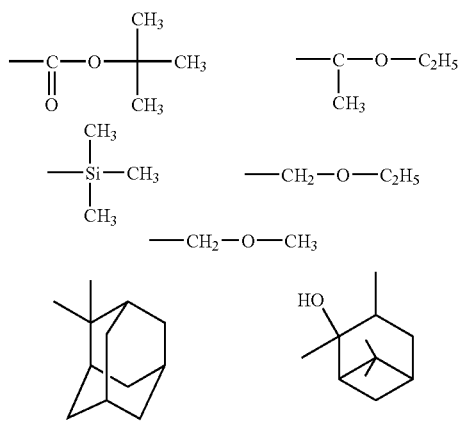

q is an integer of 0 through 5; and a and a satisfy $0<a<1$, $0<e<1$ and $0<a+e\leq 1$.

14. The pattern formation material of claim 13, wherein said base polymer is prepared through radical polymerization of said first unit and said second unit.

15. The pattern formation material of claim 13, wherein said base polymer is prepared by obtaining a polymer through radical polymerization of a precursor obtained before substituting $R_2$ for said first unit and said second unit and by allowing $R_2$ to bond to said precursor included in said polymer.

16. A pattern formation material comprising:

a base polymer including a first unit represented by Chemical Formula 2, a second unit represented by Chemical Formula 5 and a third unit represented by Chemical Formula 6; and an acid generator:

Chemical Formula 2:

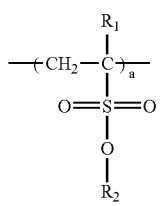

Chemical Formula 5:

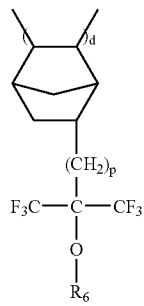

Chemical Formula 6:

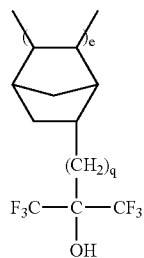

wherein $R_1$ is a hydrogen atom, a chlorine atom, a fluorine atom, an alkyl group or an alkyl group including a fluorine atom; $R_2$ is a protecting group released by an acid and is any one of the following seven compounds;

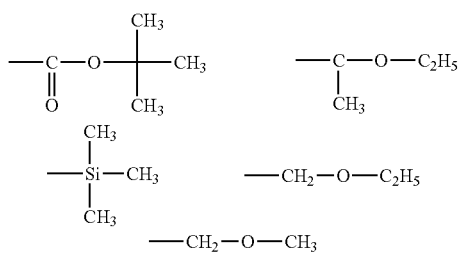

-continued

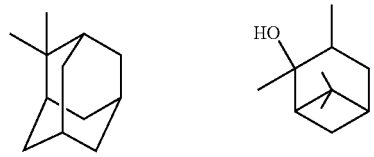

$R_6$ is an alkyl group, a cyclic aliphatic group, an aromatic group, a heterocycle, an ester group or an ether group; p and q are integers of 0 through 5; and a, d and e satisfy $0<a<1$, $0<d<1$, $0<e<1$ and $0<a+d+e\leq1$.

17. The pattern formation material of claim 16, wherein said base polymer is prepared through radical polymerization of said first unit, said second unit and said third unit.

18. The pattern formation material of claim 16, wherein said base polymer is prepared by obtaining a polymer through radical polymerization of said first unit and said third unit and by substituting $R_6$ for some of H of OH groups of said third unit included in said polymer.

19. A pattern formation method comprising the steps of forming a resist film by applying, on a substrate, a pattern formation material containing a base polymer including a first unit represented by Chemical Formula 2 and a second unit represented by Chemical Formula 3, and an acid generator:

Chemical Formula 2:

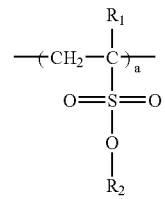

Chemical Formula 3:

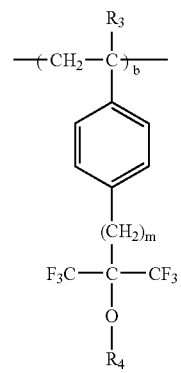

wherein $R_1$ and $R_3$ are the same or different and are a hydrogen atom, a chlorine atom, a fluorine atom, an alkyl group or an alkyl group including a fluorine atom; $R_2$ is a protecting group released by an acid and is any one of the following seven compounds;

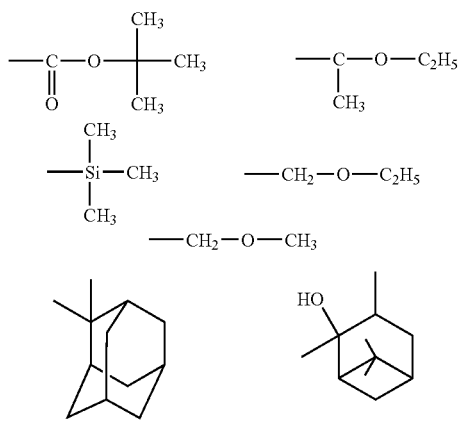

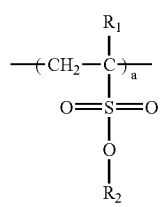

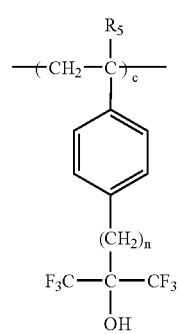

R$_4$ is an alkyl group, a cyclic aliphatic group, an aromatic group, a heterocycle, an ester group or an ether group; m is an integer of 0 through 5; and a and b satisfy $0<a<1$, $0<b<1$ and $0<a+b\leq 1$;

irradiating said resist film with exposing light of a wavelength not longer than a 180 nm band for pattern exposure; and forming a resist pattern by developing said resist film after the pattern exposure.

20. A pattern formation method comprising the steps of:

forming a resist film by applying, on a substrate, a pattern formation material containing a base polymer including a first unit represented by Chemical Formula 2 and a second unit represented by Chemical Formula 4, and an acid generator:

Chemical Formula 2:

$$\begin{array}{c}R_1\\-\!\!\!\!-\!\!(CH_2\!\!-\!\!C)_a\!\!-\!\!\!\!-\\O\!\!=\!\!S\!\!=\!\!O\\|\\O\\|\\R_2\end{array}$$

Chemical Formula 4:

$$\begin{array}{c}R_5\\-\!\!\!\!-\!\!(CH_2\!\!-\!\!C)_c\!\!-\!\!\!\!-\\\\\text{(phenyl)}\\\\(CH_2)_n\\F_3C\!\!-\!\!C\!\!-\!\!CF_3\\|\\OH\end{array}$$

wherein R$_1$ and R$_5$ are the same or different and are a hydrogen atom, a chlorine atom, a fluorine atom, an alkyl group or an alkyl group including a fluorine atom;

R$_2$ is a protecting group released by an acid and is any one of the following seven compounds;

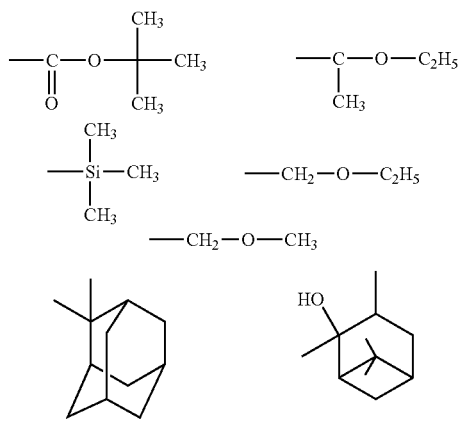

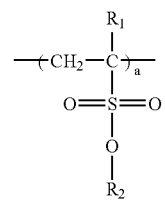

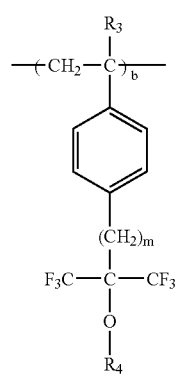

n is an integer of 0 through 5; and a and c satisfy $0<a<1$, $0<c<1$ and $0<a+c\leq 1$;

irradiating said resist film with exposing light of a wavelength not longer than a 180 nm band for pattern exposure; and forming a resist pattern by developing said resist film after the pattern exposure.

21. A pattern formation method comprising the steps of:

forming a resist film by applying, on a substrate, a pattern formation material containing a base polymer including a first unit represented by Chemical Formula 2, a second unit represented by Chemical Formula 3 and a third unit represented by Chemical Formula 4, and an acid generator:

Chemical Formula 2:

$$\begin{array}{c}R_1\\-\!\!\!\!-\!\!(CH_2\!\!-\!\!C)_a\!\!-\!\!\!\!-\\O\!\!=\!\!S\!\!=\!\!O\\|\\O\\|\\R_2\end{array}$$

Chemical Formula 3:

$$\begin{array}{c}R_3\\-\!\!\!\!-\!\!(CH_2\!\!-\!\!C)_b\!\!-\!\!\!\!-\\\\\text{(phenyl)}\\\\(CH_2)_m\\F_3C\!\!-\!\!C\!\!-\!\!CF_3\\|\\O\\|\\R_4\end{array}$$

Chemical Formula 4:

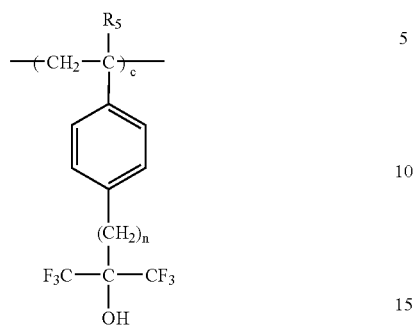

wherein $R_1$, $R_3$ and $R_5$ are the same or different and are a hydrogen atom, a chlorine atom, a fluorine atom, an alkyl group or an alkyl group including a fluorine atom; $R_2$ is a protecting group released by an acid and is any one of the following seven compounds;

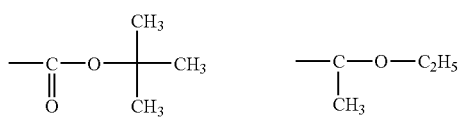

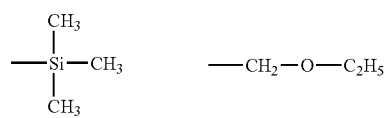

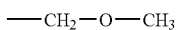

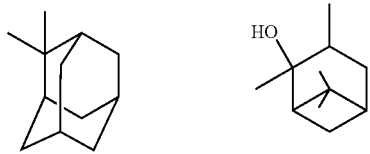

$R_4$ is an alkyl group, a cyclic aliphatic group, an aromatic group, a heterocycle, an ester group or an ether group; m and n are integers of 0 through 5; and a, b and c satisfy $0<a<1$, $0<b<1$, $0<c<1$ and $0<a+b+c\leq 1$;

irradiating said resist film with exposing light of a wavelength not longer than a 180 inn band for pattern exposure; and forming a resist pattern by developing said resist film after the pattern exposure.

22. A pattern formation method comprising the steps of:

forming a resist film by applying, on a substrate, a pattern formation material containing a base polymer including a first unit represented by Chemical Formula 2 and a second unit represented by Chemical Formula 5, and an acid generator:

Chemical Formula 2:

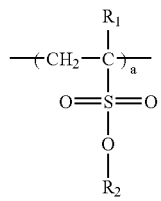

Chemical Formula 5:

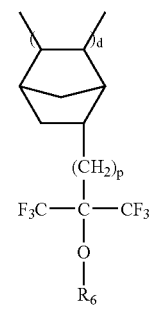

wherein $R_1$ is a hydrogen atom, a chlorine atom, a fluorine atom, an alkyl group or an alkyl group including a fluorine atom; $R_2$ is a protecting group released by an acid and is any one of the following seven compounds;

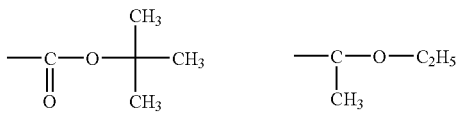

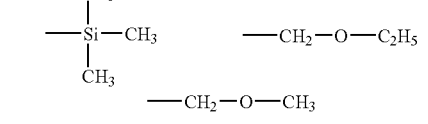

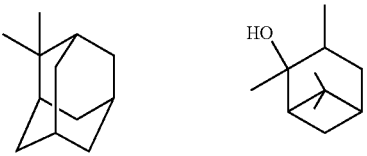

$R_6$ is an alkyl group, a cyclic aliphatic group, an aromatic group, a heterocycle, an ester group or an ether group; p is an integer of 0 through 5; and a and d satisfy $0<a<1$, $0<d<1$ and $0<a+d\leq 1$;

irradiating said resist film with exposing light of a wavelength not longer than a 180 nm band for pattern exposure; and forming a resist pattern by developing said resist film after the pattern exposure.

23. A pattern formation method comprising the steps of:

forming a resist film by applying, on a substrate, a pattern formation material containing a base polymer including a first unit represented by Chemical Formula 2 and a second unit represented by Chemical Formula 6, and an acid generator:

Chemical Formula 2:

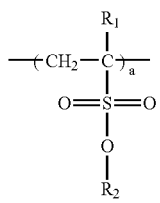

Chemical Formula 6:

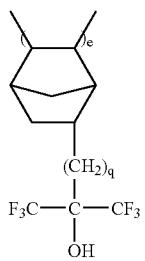

wherein $R_1$ is a hydrogen atom, a chlorine atom, a fluorine atom, an alkyl group or an alkyl group including a fluorine atom; $R_2$ is a protecting group released by an acid and is any one of the following seven compounds;

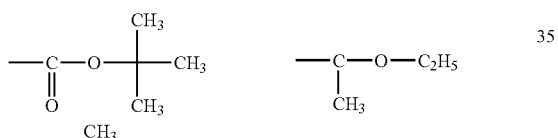

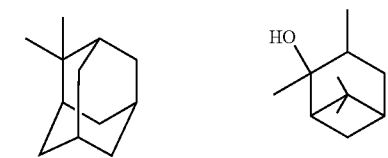

q is an integer of 0 through 5; and a and e satisfy $0<a<1$, $0<e<1$ and $0<a+e\leq1$;

irradiating said resist film with exposing light of a wavelength not longer than a 180 nm band for pattern exposure; and forming a resist pattern by developing said resist film after the pattern exposure.

24. A pattern formation method comprising the steps of forming a resist film by applying, on a substrate, a pattern formation material containing a base polymer including a first unit represented by Chemical Formula 2, a second unit represented by Chemical Formula 5 and a third unit represented by Chemical Formula 6, and an acid generator:

Chemical Formula 2:

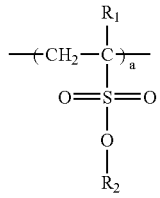

Chemical Formula 5:

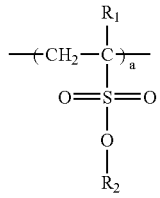

Chemical Formula 6:

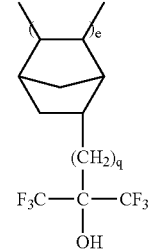

wherein $R_1$ is a hydrogen atom, a chlorine atom, a fluorine atom, and alkyl group or an alkyl group including a fluorine atom; $R_2$ is a protecting group released by an acid and is any one of the following seven compounds;

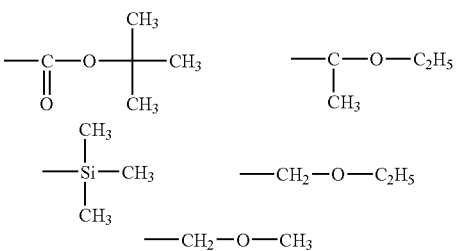

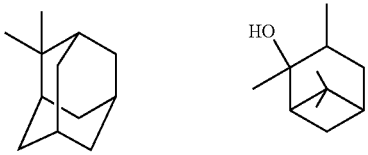

R$_6$ is an alkyl group, a cyclic aliphatic group, an aromatic group, a heterocycle, an ester group or an ether group; p and q are integers of 0 through 5; and a, d and e satisfy 0<a<1, 0<d<1, 0<e<1 and 0<a+d+e≦1;

irradiating said resist film with exposing light of a wavelength not longer than a 180 nm band for pattern exposure; and forming a resist pattern by developing said resist film after the pattern exposure.

25. The pattern formation method of any of claims 19 through 24,
wherein said exposing light is a Xe$_2$ laser beam, a F$_2$ laser beam, a Kr$_2$ laser beam, an ArKr laser beam or an Ar$_2$ laser beam.

26. The pattern formation method of any of claims 19 through 24,
wherein said exposing light is a soft-X ray beam.

27. The pattern formation method of any of claims 19 through 24,
wherein said exposing light is a hard-X ray beam.

* * * * *

UNITED STATES PATENT AND TRADEMARK OFFICE
CERTIFICATE OF CORRECTION

| | |
|---|---|
| PATENT NO. | : 7,041,428 B2 |
| APPLICATION NO. | : 10/415272 |
| DATED | : May 9, 2006 |
| INVENTOR(S) | : Shinji Kishimura et al. |

It is certified that error appears in the above-identified patent and that said Letters Patent is hereby corrected as shown below:

On the Title page of the Letters Patent,

Under section "(56) References Cited, U.S. PATENT DOCUMENTS", change, " 6,916,592 B1 " to -- 6,916,592 B2 --

Under section "(56) References cited, FOREIGN PATENT DOCUMENTS", delete " JP 2000-330289  11/2000 "

Under section "(57) ABSTRACT", correct the bottom element of the formula "$R_2$" from overlapping the first line of the subsequent text.

Signed and Sealed this

Twenty-eighth Day of August, 2007

JON W. DUDAS
*Director of the United States Patent and Trademark Office*